(12) United States Patent
Coty et al.

(10) Patent No.: US 8,067,945 B2
(45) Date of Patent: Nov. 29, 2011

(54) METHOD AND APPARATUS FOR MONITORING A MATERIAL MEDIUM

(75) Inventors: Constance Coty, Whitehouse, NJ (US); Lusheng Ji, Randolph, NJ (US); Robert Miller, Convent Station, NJ (US); Harry Worstell, Florham Park, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 507 days.

(21) Appl. No.: 12/006,331

(22) Filed: Jan. 2, 2008

(65) Prior Publication Data

US 2009/0167522 A1 Jul. 2, 2009

(51) Int. Cl.
*G01R 31/02* (2006.01)
*H04B 3/46* (2006.01)

(52) U.S. Cl. ........................ 324/539; 324/543
(58) Field of Classification Search ............ 324/539, 324/543
See application file for complete search history.

(56) References Cited

U.S. PATENT DOCUMENTS

| | | | |
|---|---|---|---|
| 4,525,873 A * | 6/1985 | Baues | 398/168 |
| 5,206,595 A | 4/1993 | Wiggins et al. | |
| 6,617,859 B1 * | 9/2003 | Orton | 324/544 |
| 6,674,518 B1 | 1/2004 | Asher et al. | |
| 6,788,650 B2 * | 9/2004 | Chen et al. | 370/254 |
| 6,807,370 B2 | 10/2004 | Harasawa | |
| 7,057,401 B2 * | 6/2006 | Blades | 324/713 |
| 7,088,880 B1 | 8/2006 | Gershman | |
| 7,245,800 B1 | 7/2007 | Uhlhorn | |
| 7,274,305 B1 * | 9/2007 | Luttrell | 340/870.02 |
| 7,403,015 B2 * | 7/2008 | Carlino et al. | 324/424 |
| 7,526,944 B2 * | 5/2009 | Sabata et al. | 73/49.1 |
| 7,714,592 B2 * | 5/2010 | Radtke et al. | 324/629 |
| 2006/0187074 A1 * | 8/2006 | O'Sullivan et al. | 340/660 |
| 2006/0233312 A1 | 10/2006 | Adams, Jr. et al. | |
| 2006/0233485 A1 * | 10/2006 | Allen | 385/13 |
| 2006/0241880 A1 * | 10/2006 | Forth et al. | 702/60 |
| 2008/0097706 A1 * | 4/2008 | McCormack et al. | 702/59 |

* cited by examiner

*Primary Examiner* — Jeff Natalini

(57) ABSTRACT

A material medium, such as an optical fiber or electrical cable, is commonly used to carry services, such as telecommunications or energy service. The current invention identifies the following problems which may be encountered when monitoring a material medium. They are: (1) requiring a time and labor intensive investigation to find a fault, (2) needing a significant change in a current material medium infrastructure to support a monitoring effort, or (3) reducing available bandwidth in a material medium due to a monitoring device intruding into the material medium to send data. These problems are solved, in accordance with a feature of the current invention, by monitoring a material medium with at least one diagnostic sensor, and using an electromagnetic (EM) signal, such as radio frequency (RF), signal to wirelessly transmit the sensor data. The diagnostic sensor may measure the operational health of the material medium, or may measure local environmental conditions around the material medium. Using an EM signal, such as RF, to wirelessly transmit sensor data allows for a fast, low labor monitoring approach. Additionally, it avoids a need to either; (1) transfer the data by intruding into the monitored material medium, or (2) set up an independent material medium system to transfer the data.

20 Claims, 15 Drawing Sheets

FIG. 5
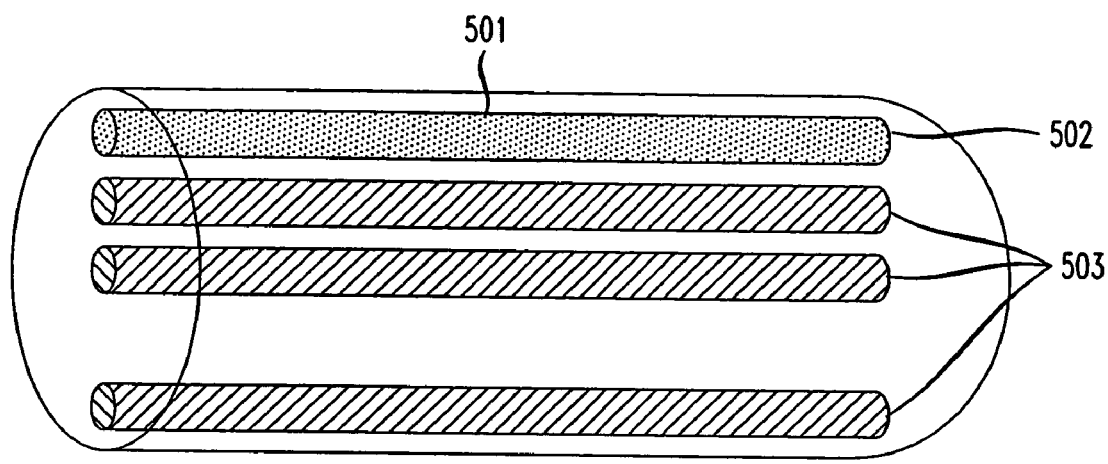
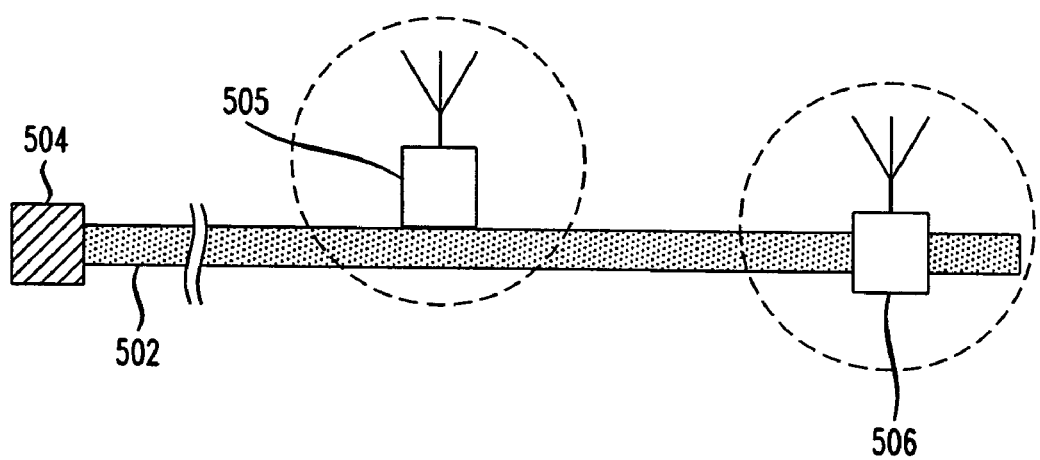

METHOD AND APPARATUS FOR MONITORING A MATERIAL MEDIUM

BACKGROUND OF THE INVENTION

The present invention relates generally to a material transmission medium, and more particularly to method of monitoring the transmission medium.

There are multiple industries which rely upon long stretches of a material medium in order to deliver a service to dispersed customers. Examples of such industries include (1) telecommunications and (2) electrical power. Effective delivery of these services requires that the integrity of the material medium be maintained.

Unfortunately, it is common for a portion of the material medium to experience an environmental condition or acute stress that causes the material medium to become inoperable or physically compromised. Currently, significant labor, time and money are spent in trying to determine the location and cause of a material medium's compromise.

Even when a location of a problem in the material medium is identified, the reason for the problem is often not determined. The inability to determine a cause of the problem may be due, at least in part, to the extended time needed to determine the cause. By the time the fault is located, the cause of the problem may have already dissipated or relocated. For example, if the fault was caused by flooding, the water may have receded, leaving no sign of flooding that led to the fault. Alternatively, if the problem was caused by a physical blow to the material medium, the cause of the blow is likely to be far removed by the time the location of the fault is detected. There are several other potentially damaging forces which are similarly transient and leave little trace once the damage has been done.

Therefore, it would be advantageous for suppliers of services over material transmission media to have a method for more quickly and accurately determining the location and/or the cause of a problem in the transmission medium.

Even more advantageously, suppliers of the service would benefit from being able to preempt a problem by assessing that there is a threat to a material transmission medium before there is a loss of service. If they were able to make such an assessment, the suppliers could attempt to remove or manage potential problems before their service is interrupted.

However relevant industries face significant limitations on what they can do to monitor their material media. Often, the material medium network is already installed. Therefore, a monitoring system would have to be readily adaptable to the already existing infrastructure. Additionally, "bandwidth"—the transmission capability of the material medium—may be near maximum. This means that a monitoring system would be prohibitive if it required utilizing significant bandwidth in the material medium as part of the monitoring or reporting process.

While there may be methods that are currently used for determining the location of faults; these methods tend to be slow, labor intensive, and inaccurate. Therefore, there is a need to develop a quicker, less labor intensive, and more accurate method of fault detection. Additionally, it would be advantageous if this monitoring system could also predict problematic areas in order to facilitate preventative maintenance.

There is therefore a need for an improved system and method of monitoring a material medium.

The current invention is based, at least in part, on a recognition of the following limitations which may be encountered when monitoring a material medium for a fault or a potential fault: (1) the amount of time and labor needed to find a fault, (2) the need for change in a current material medium infrastructure to support a monitoring effort, or (3) the reduction in available bandwidth in a material medium due to a monitoring device using the material medium to send data.

BRIEF SUMMARY OF THE INVENTION

These limitations are avoided, in accordance with one embodiment of the current invention, by monitoring a material medium with at least one diagnostic sensor, and using an electromagnetic wave (EM) signal, such as a radio frequency (RF) signal, to wirelessly transmit the sensor data. The diagnostic sensor may measure the operational health of the material medium or of the local environment around the material medium. Using an EM signal to transmit sensor data allows for a fast, low labor-intensive monitoring approach. Additionally, it avoids the need to either; (1) transfer the data by intruding into the monitored material medium, or (2) set up an independent material medium system to transfer the data.

In accordance with another embodiment of the invention, the diagnostic sensor and/or the means for transmitting an EM signal—may be powered by induction from the EM energy flowing within the material medium or within a conduit which houses the material medium. Examples of a material medium include an optical fiber or an electrical cable. Utilizing induction as the primary power source avoids the need to power the sensor and transmitter by: (1) intruding into the material medium being monitored, (2) setting up an independent network of material medium, or (3) using an exhaustible power supply such as a non-rechargeable battery. In one example, an energy harvesting module is used to capture the energy induced, using any scientific phenomenon, by an EM energy flow in the material medium. In a further example, the energy harvesting module includes a capacitor-like slow-charging electrical storing device to store energy.

In accordance with another embodiment of the invention, the diagnostic sensor itself contains RF transmission means for transmitting sensor data. In another embodiment, there is a separate EM transmission device that is used to transmit the sensor data.

In accordance with a further embodiment of the invention, the means for transmitting an RF signal—whether it is part of the diagnostic sensor or a separate device in communication with the diagnostic sensor—is able to self-organize into a store-and-forward multi-hop wireless mesh network with another device enabled to transmit an RF signal.

In accordance with another embodiment of the invention, the RF signal is transmitted utilizing a waveguide. Some examples of objects which can be used as waveguides include a material medium and the conduit housing a material medium. For the purposes of this invention, transmitting a wireless EM signal—such as an RF signal—over a waveguide is considered a wireless transmission. A wired transmission is when non-wireless EM signal is transmitted by a material medium.

In accordance with another embodiment of the invention, the diagnostic sensor measurements are retrieved from the wireless mesh network by communicatively linking a roaming unit—the roaming unit capable of receiving an RF signal—to a device within the wireless mesh network, the device being able to transmit an RF signal to the roaming unit.

In accordance with another embodiment of the invention, diagnostic sensor data is transmitted to a back haul network, wherein—within the mesh network—at least one of the devices capable of transmitting RF signal is in communication with the back haul network. In one embodiment, the back haul network is the Internet.

In accordance with another embodiment of the invention, the device capable of transmitting an RF signal is a device selected from the following list: a Zigbee device, a Wibree device, an EnOcean device, and a SNAP device.

In accordance with another embodiment of the invention, the material medium being monitored is placed under the ground.

In accordance with another embodiment of the invention, the material medium being monitored is located inside a facility, building, or residence. In one embodiment, the material medium goes to an end-user's device inside the facility, building, or residence.

In accordance with another embodiment of the invention, the diagnostic sensor is used to measure one of the following: (1) EM energy flow, (2) temperature, (3) pressure, (4) moisture, (5) vibration, (6) percentage of a designated chemical, and (7) wind speed. In one embodiment, these diagnostic sensor measurements are used to monitor an operational status of a material medium. In another embodiment, these diagnostic sensor measurements are used to monitor a structure or natural resource in the vicinity of the material medium. Some examples include monitoring: a bridge, a tunnel, a highway, a railroad track, and a body of water.

These and other advantages of the invention will be apparent to those of ordinary skill in the art by reference to the following detailed description and the accompanying drawings.

BRIEF DESCRIPTION OF THE DRAWINGS

FIG. 5 further illustrates powering options for a material medium, specifically an optical fiber.

DETAILED DESCRIPTION

There are multiple industries which rely upon long stretches of material medium in order to deliver a service to disperse customers. Examples include (1) the telecommunications industry and (2) the electrical power industry. Effective delivery of these services requires that the integrity of the material medium be maintained.

However, with so many miles of material medium, it is common for a portion of material medium to experience some environmental condition or acute stress that causes the material medium to become inoperable or physically compromised. Currently, significant labor, time and money are spent in trying to determine the location and cause of such a compromise.

Figure 1:
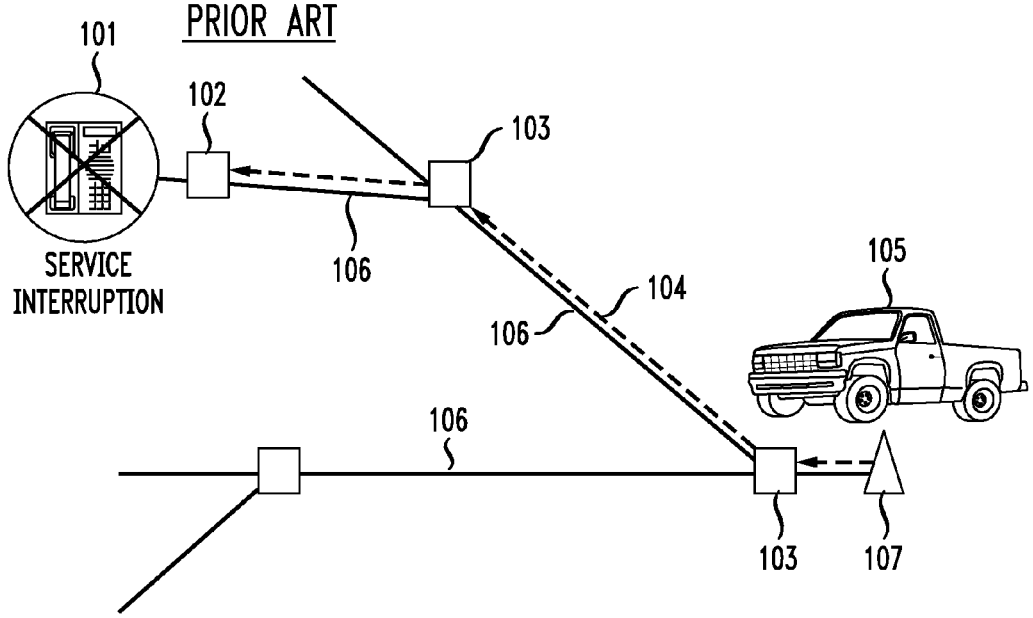
FIG. 1 is a schematic representation of a prior art system for troubleshooting a downed telecommunication's material medium.

FIG. 1 shows an exemplary prior art system for troubleshooting a failed telecommunication's material medium. A customer, noticing a telephone service interruption, 101, contacts a telecomm service provider and informs the service provider of an inoperable telephone line.

In order to locate the trouble spot in the communication's material medium, 106, the service provider may use a testing tone generator, 107, to generate test signals, 104, from a particular location. Then, the provider checks at various demarcation (DMARC) points, 103, along the material medium to see if the signal is received. At the customer's location, a final DMARC point, 102, is checked before the telephone service enters the user's home. When it is determined where the test signals are no longer detected, the service provider is able to identify a stretch of material medium that is the likely location of the fault.

The next step, however, leads to considerable delay and monetary expenditure. The service provider sends out a repair employee or team, 105, into the field to search for the faulty stretch of material medium. Since there is often a significant distance between DMARC points, finding the specific location of the fault in the material medium involves significant effort. Furthermore, for the repair employee or team to investigate the material medium's ability to carry signal at a particular location, the material medium needs to be physically accessed. This can be quite difficult if the material medium is located in a hard to access location, such as below the ground or high in the air. Accessing the line needs to be repeated several times until the fault location is finally pinpointed.

In additional to the extended delay causing the customer anguish and the service provide significant labor expenses, this delay causes another problem. Since it may take significant time to find the specific location of the fault, by the time location is determined the reason for the problem is often not determined. The inability to determine a root cause of the problem may be due—at least in part—by the extended time needed to determine the cause. By the time the fault is located, the cause of the fault may have already dissipated or relocated. For example, if the fault was caused by flooding, the water may have receded, leaving no sign of the flooding that led to the fault. Alternatively, if the fault was caused by a physical blow to the material medium, the cause of the blow is likely to be far removed by the time the location of the fault is detected. There are several other potentially damaging forces which are also transient and leave little trace once there have dissipated.

Many the barriers stand in the way of improving this problem. For example, many material medium networks are already established. Therefore, a monitoring system would have to be adaptable to the present infrastructure, such as below ground and elevated material media. Additionally, "bandwidth"—the service capacity of a material medium—is often near maximum capacity. This means that a monitoring system would be prohibitive if it required utilizing significant bandwidth in the material medium. Bandwidth may be reduced if the monitoring system utilizes the material medium to either receive power or transmit data.

Given the current constraints, there is therefore a need for a system and method of monitoring a material medium which significantly improves upon current methods of fault detection. Additionally, it would be advantageous if an improved monitoring system could also predict problematic areas in order to facilitate preventative maintenance.

Therefore, it would be advantageous to have a system and method for more quickly and accurately assessing a cause of a fault that can both: (1) integrate into existing material media infrastructure, and (2) minimize use of material medium bandwidth. Additionally, it is desired to have a system and method for being able to predict future problems by assessing a potential threat to a material medium before there is a loss of service.

The current invention solves the following challenges that are encountered when currently monitoring a material medium for a fault or a potential fault: (1) requiring a time and labor intensive investigation to find a fault, (2) needing a significant change in a current material medium infrastructure to support a monitoring effort, or (3) reducing available bandwidth in a material medium due to a monitoring device intruding into the material medium to send data. These challenges are avoided, in accordance with a feature of the current invention, by monitoring a material medium with at least one diagnostic sensor, and using an electromagnetic wave (EM) signal to transmit the sensor data. The diagnostic sensor may measure the operational health of the material medium, or the status of the local environment around the material medium. Using an EM signal such as a radio frequency (RF) signal to wirelessly transmit sensor data allows for a fast, low labor monitoring approach. Additionally, it avoids a need to either; (1) transfer the data by intruding into the monitored material medium, or (2) set up an independent material medium system to transfer the data.

Figure 2:
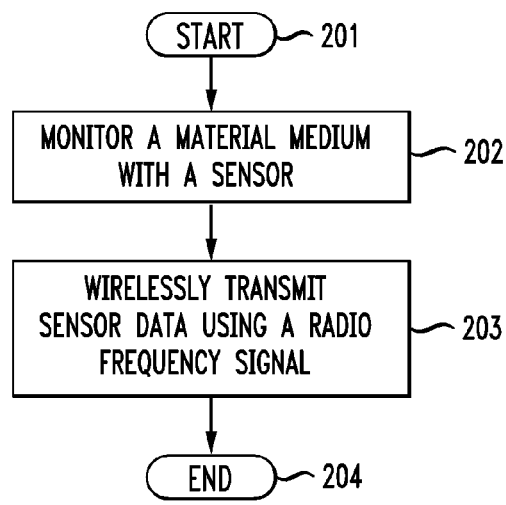
FIG. 2 is a flowchart representing a process used in an aspect of the current invention.

FIG. 2 illustrates the above solution with a flowchart. After the process is begun, at step 201, a location on a material medium is monitored with a diagnostic sensor, at step 202. Data from the diagnostic sensor is then wirelessly transmitted using an EM signal, such as an RF signal, at step 203. The process ends at step 204.

This aspect of the current invention solves the previously mentioned problems in the background art in at least the following ways. The diagnostic sensor can be placed anywhere along a material medium, and is not dependent on gaining physical access to the inside of the material medium. In the example of the telecomm industry, this means that a diagnostic sensor does not need to be placed at a DMARC point. Therefore, a utility service provider has significantly more flexibility than in the prior art. The status at any point along a material medium can be assessed automatically by the diagnostic sensor and transmitted by EM signal. This gives insight into the material medium's operation without needing to physically access the material medium. Additionally, wireless transmission of the diagnostic sensor data with an EM signal, such as an RF signal, avoids a need to (1) transfer the data by intruding into the process being monitored, or (2) setting up an independent material medium system to transfer the data. Since there is no limit on how many sensor setups are placed along a material medium, the service provider can get as much real time sensitivity as they want by simply placing more sensor setups along the material medium.

Figure 3:
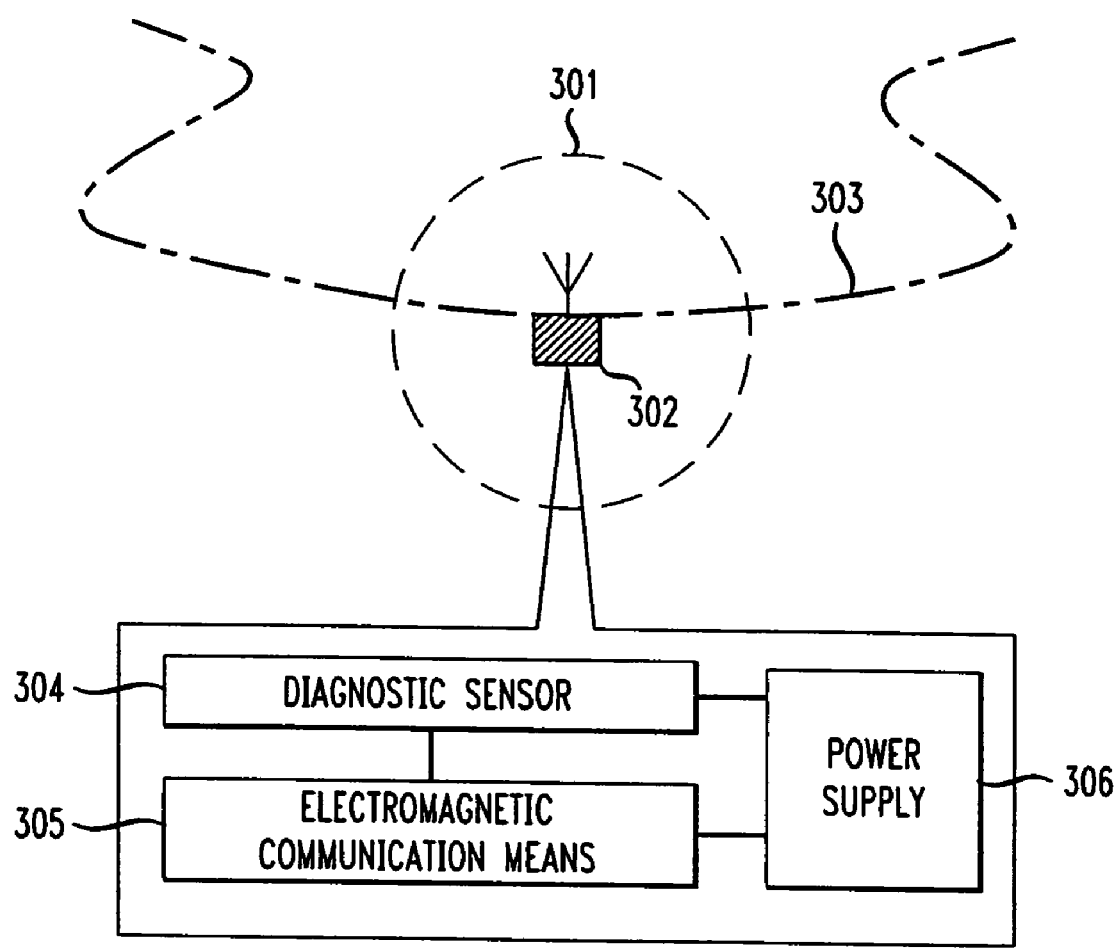
FIG. 3 is a schematic representation of a system according to the current invention for monitoring and troubleshooting any material medium, including powering the monitoring instrumentation.

FIG. 3 is a schematic representation of a system according to the current invention for monitoring and troubleshooting any material medium, including powering the monitoring instrumentation. A sensor system comprises a diagnostic sensor, 304, and an EM communication means, 305. In one example, an RF signal is the EM signal used. The sensor setup receives its power from a power source, 306. The sensor setup as a whole is shown as 302. It is located in the vicinity of a material medium, 303. The EM communication range is represented by 301, which shows how far the EM signal may be transmitted by the EM communication means. Some examples of the capabilities of a diagnostic sensor are measuring the presence and quality of electromagnetic (EM) flow along a material medium, and measuring the local environmental conditions in proximity to the material medium—for example temperature, moisture, and pressure. Diagnostic sensor functions are discussed further in FIG. 18.

In one embodiment, the EM communication means, 305, may be a part of the diagnostic sensor. In another embodiment, 305 may be a separate device connected to the diagnostic sensor. In yet a further embodiment, 305 may be a separate device in communication with the diagnostic sensor, but not otherwise physically connected to it.

There are several options available for powering the sensor setup. The most straight forward method is using a power line. The advantage of this option is that it provides a continuous supply of electrical power, which enables a device to perform more complex computations. The disadvantage of this option is the limited availability of such a continuous supply of electrical power. In order for a sensor setup to access a power line, this setup must be: (1) installed at a demarcation (DMARC) point which is a location where the material medium can be more easily accessed, (2) placed at a point where the material medium has been accessed, or (3) powered by a separate power line.

Each of these options for providing power has a disadvantage. If power is obtained by placing the sensor only at DMARCs, then only a few such points exist along long stretches of material medium. Thus, only a few sensor setups would be able to be located next to the material medium. Additionally, sending power over the material medium being monitored decreases the available bandwidth. This runs counter to a primary goal of the current invention, which is to maintain as much bandwidth as possible for use in transmitting the utility's EM energy. A disadvantage to providing special access points in the material medium for the sensor setups is that this requires significant labor and therefore cost to install, especially if multiple sensor setups will be used to monitor the material medium. A disadvantage to running a separate power line is that this line itself requires its own periodic maintenance and acute troubleshooting if the power line goes down. This adds significant cost and labor to maintaining the material medium, which runs counter to a primary goal of the current invention. Additionally, significant labor and material cost will be accrued with such an installation, especially since a material medium is often installed in hard to reach locations—such as below ground or elevated from ground level.

Due to the disadvantages of providing power line access, such a powering scheme may be reserved for use with special sensor setups that need the continuous power supply to run more resource consuming tasks. In one embodiment, these special sensor setups are located at DMARC points, which is usually the most straightforward of the three power line access options previously mentioned to implement.

Another option for powering a sensor setup is to use regular batteries. Some of the advantages of regular batteries are that they provide continuous power and they are relatively inexpensive to implement. However, a significant disadvantage to using regular batteries is that they are exhaustible—they eventually lose their charge. When a battery loses its charge, it must either be replaced or recharged off-line, when a recharging is an option.

Due to the disadvantage of being exhaustible, the most practical use for a regular battery is as an easy backup power supply. However, in one embodiment, a regular battery is used as a primary power source when no other powering option is feasible.

A further option for powering the sensor setup—which, in one embodiment, is the most preferred option—is using energy induced by an electromagnetic (EM) energy flow of a utility through the material medium or through a conduit which houses a material medium. Transporting EM energy through a conduit which houses the material medium allows using this powering method even when the energy flow on the material medium is not sufficient.

In one embodiment, the energy induced by EM energy is captured by an energy harvesting module. Energy harvesting is the process of capturing and accumulating energy from an energy source as energy from it becomes available; storing that energy for a period of time, and processing the energy as appropriate so that it is in a form that can be used later, for instance to operate a microprocessor within the latter's operating limits. Since typically the signal voltage being carried on a material medium is too low to be suitable for directly powering the sensor setup by means of induction, the energy harvesting module may use a capacitor-like slow-charging electrical storage device to gradually accumulate the needed energy.

Since the needed power is gathered gradually, a sensor setup powered by an energy harvesting module—in one embodiment—will operate over limited time cycles. Once the electrical storage device is charged beyond a preset operation capacity, it begins to discharge. This discharge effectively turns on the sensor setup, which begins a task cycle. The basic requirement for a system powered by energy harvesting is that the electrical storage device is not drained within the active period of each task cycle, and is sufficiently charged again during an inactive period in order to power another task cycle.

Using energy induced energy to power a sensor setup gives a great degree of flexibility in monitoring a material medium. This method of powering is ideal for sensor setups placed at locations along a material medium which are not DMARC points. Such a powering scheme also avoids a need to setup a secondary power line to power sensor setups. In one embodiment, a majority of sensor setups could be powered by capturing induced energy flow. This embodiment gives flexibility to provide specific information pertinent to small stretches of material medium; even when DMARC points are far from each other, accessing the material medium is not a viable option, and no secondary power line is available.

The sensor setups that are powered by means of energy induced by EM energy, in one embodiment, are reserved for: (1) less involved functions, and (2) functions that are acceptably performed in pulses. Some examples of acceptable functions include making a diagnostic sensor measurement and transmitting the measurement data using an RF signal.

In one embodiment, when a sensor setup operates in cycles, they have a task cycle that is divided into two phases, a sensing phase followed by a communication phase. The full length of a task cycle is determined by the electrical storage device's capacity. When choosing a capacitor-like slow-charging electrical storage device to power the sensor setup, it is selected such that there is enough time to complete a full communication handshake—i.e. to transmit an RF signal with the diagnostic sensor data. The length of the diagnostic sensing phase is the difference between the length of the task cycle and the length of the communication phase. It also needs to be recognized that there is a charging period in addition to the task cycle. The charging period is the amount of time required to collect enough induced energy to power one task cycle.

To summarize the previously mentioned powering options, providing primary power to a sensor setup by means of energy induced by EM energy flow along a material medium or conduit surround the material medium is ideal because it avoids a need to: (1) intrude into the material medium being monitored, (2) set up an independent network of material medium to power the sensor setup, or (3) use an exhaustible power supply such as a regular battery. However, due to the cyclical nature associated with the slow capturing of energy, more complicated device functions that require continual powering may be reserved for other types of powering options.

Figure 4:
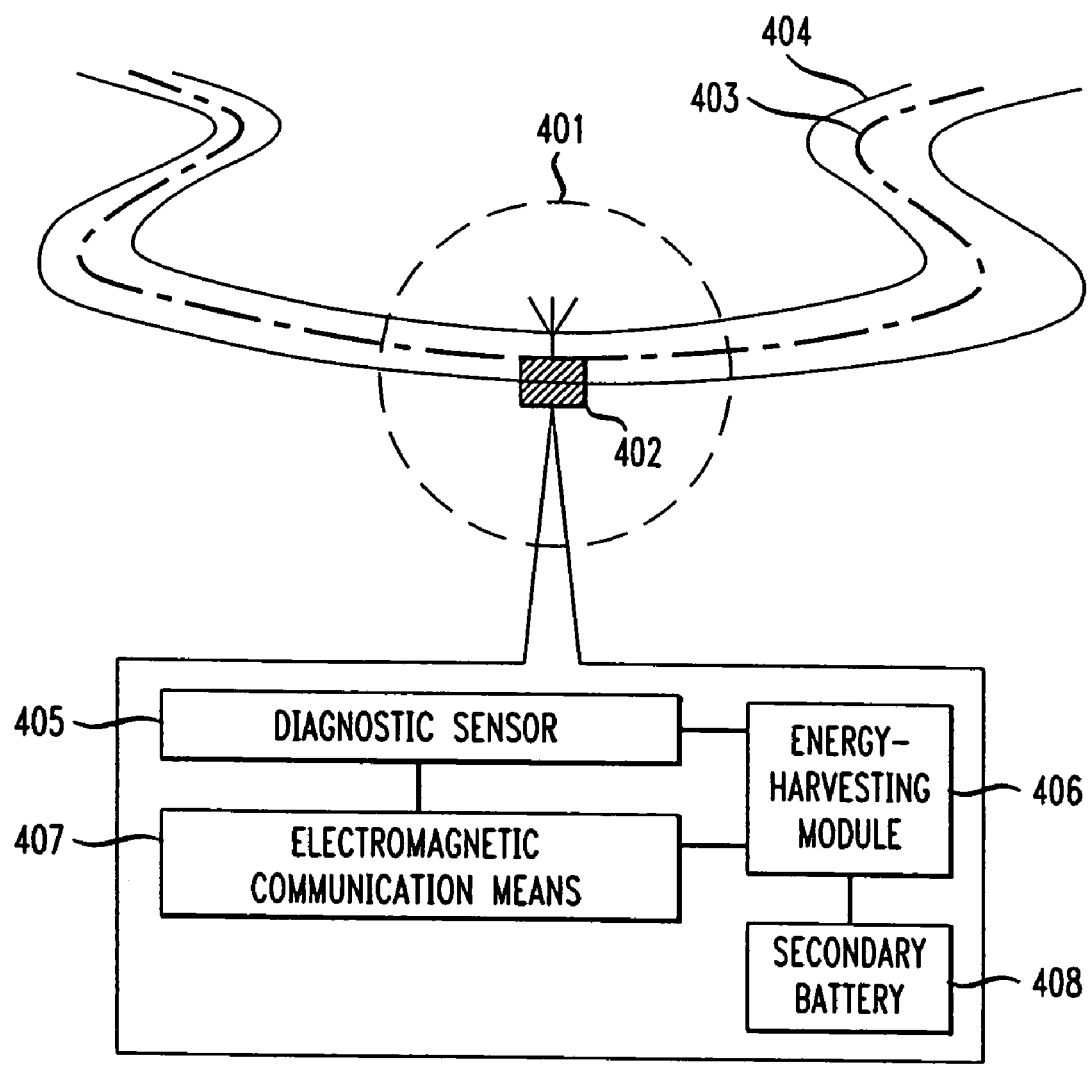
FIG. 4 is a schematic representation of alternative powering options according to an aspect of the current invention.

FIG. 4 is a schematic representation of alternative powering options according to an aspect of the current invention. This figure illustrates capturing induced EM energy by means of an energy harvesting module as the primary power supply for the sensor setup. A sensor setup comprising a diagnostic sensor, 405, and an RF communication means, 407, are linked to an energy harvesting module, 406. This module captures energy induced by EM energy flow along a material medium, 403, or a conduit surrounding the material medium, 404, with a capacitor-like slow-charging electrical storage device until the device reaches a preset operating capacity, at which point it begins to discharge. As a backup, a secondary battery, 408, is utilized. One advantage to having a backup power supply for the sensor setup is that even if the material medium has a fault—thus eliminating energy induced by EM energy flow—the sensor setup can still make its measurement and transmit the measurement data. Such measurements from the sensor setup may be instrumental in quickly pinpointing the location and cause of the fault in the material medium.

The sensor setup as a whole is shown as 402. It is located on a material medium. The RF communication range is represented by 401, which shows how far the RF signal may be transmitted by the RF communication means.

The RF communication means, as in FIG. 3, may be a part of the diagnostic sensor, physically attached to the diagnostic sensor as a separate device, or just communicatively connected to the diagnostic sensor.

FIG. 5 further illustrates some powering options for a material medium, specifically an optical fiber. What has been referred to as a "fiber", 501, is actually comprised of many individual fibers. In one embodiment, most fibers, 503, are reserved for communication purposes, thus preserving the integrity of the fiber's bandwidth. However, one or more fibers, 502, is reserved for transmitting higher levels of EM energy than are being transmitted in the other fibers. This method captures induced energy from leakages associated with loss phenomena of optical signals along a fiber. The one or more fibers transmitting higher levels of EM energy is illustrated further in the second picture in the figure. A powering laser, 504, emits EM energy into the fiber, 502. A sensor setup, 506, may be placed at a DMARC point where it can intrude into the fiber to receive the EM energy to power itself. Alternatively, at 505, a sensor setup can be placed in proximately to the fiber and capture energy induced by the EM energy flow through the leakages associated with an optical fiber's loss phenomena. The setup scenario in 505 greatly expands the number of sensor setups that can be placed along the fiber, since its location is independent of needing a DMARC point.

Figure 6:
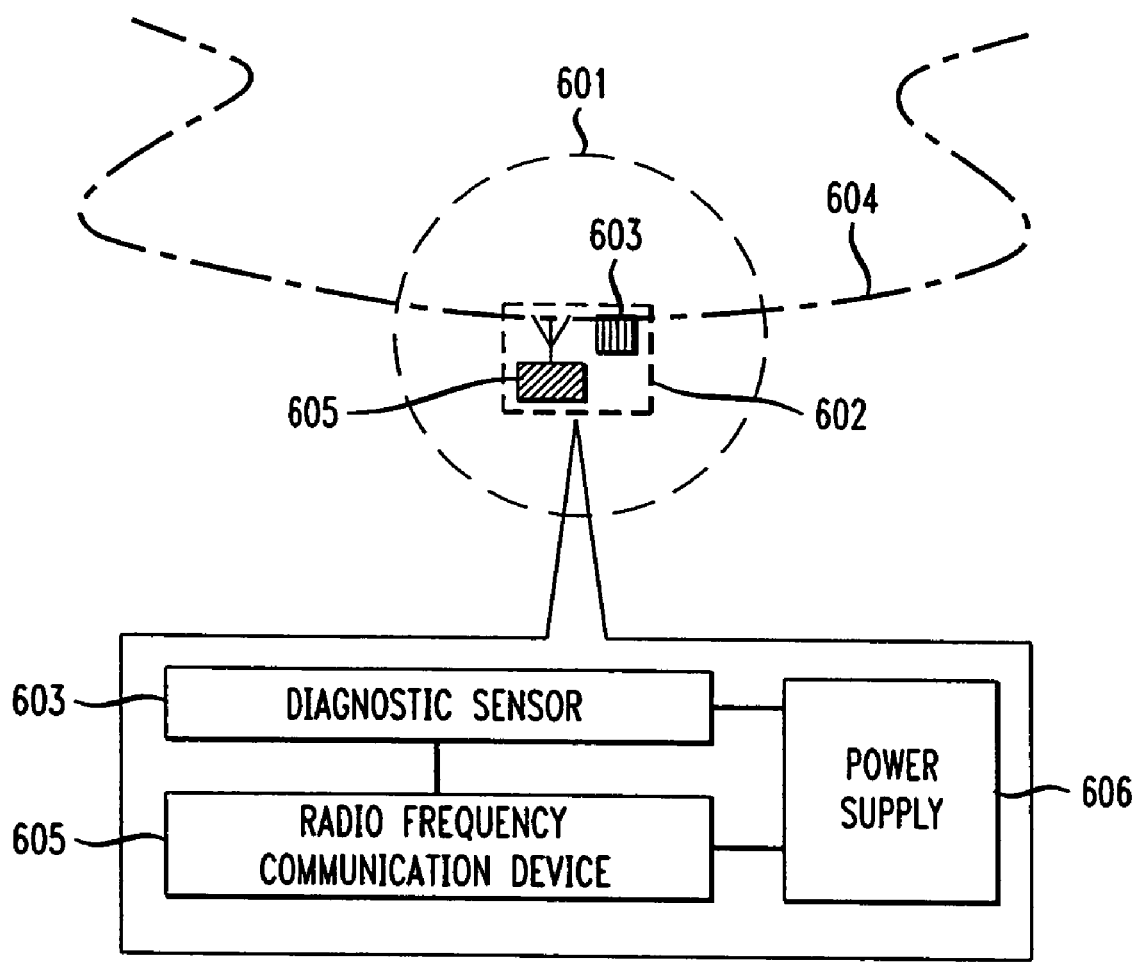
FIG. 6 is a schematic representation of an interconnection between separate devices, one for monitoring and the other for transmitting data.

FIG. 6 is a schematic representation of an interconnection between separate devices, one for monitoring and the other for transmitting data. A diagnostic sensor, 603, is used for monitoring a material medium, 604. An RF signal transmission device, 605, is used to transmit diagnostic sensor data. In one embodiment, the two devices are electronically and communicatively linked to one another. In another embodiment, the two devices are just communicatively linked to one another. In the figure, the dashed-lined rectangular, 602, around the two devices is meant to represent either of these two embodiments. The equipment inside these dotted lines is referred to as the "sensor setup". The RF communication range is represented by 601. Each of the devices is electronically connected—either directly or indirectly—to a power supply, 606. In one embodiment, one power supply is used to power both devices. In another embodiment, each device has its own power supply.

RF signal transmissions can be collected in different ways. When a monitoring scheme involves only one setup, receipt of an RF transmission is relatively straight-forward. However, when a monitoring scheme involves placing multiple sensor setups throughout a material medium, collection of all of the diagnostic sensor data becomes more complicated. Two scenarios for collecting the diagnostic sensor data are described herein. For the purposes of clarity, one such scenario is called a Harvesting Scenario while the other scenario is called a Mesh Network Scenario. Different types of RF signal transmission devices may be utilized in the different scenarios, as will now be described.

In the Harvesting Scenario, the demands on each RF transmission device are relatively minimal. Therefore, it is sufficient to power each RF transmission device cyclically. Powering a setup cyclically is usually reserved for simple functions such as diagnostic sensing and RF signal transmission. For the Harvesting Scenario, these simple functions are sufficient.

The Harvesting Scenario is effective at detecting when the material medium network is up and running as well as the quality of the EM energy transmission. In one embodiment, a testing signal generator installed at a material medium's head periodically generates testing tones. The tones may be sent continuously or periodically in short bursts. In the latter case, the frequency of these test tone transmissions depends on the minimum length of the sensing phase of the sensor setup. The sensing phase measures the qualities of the testing tones sent by this generator. At least one testing tone burst should be generated during the sensing phase.

During the sensing phase, the diagnostic sensor will measure the quality of the testing tones it receives. Post processing such as averaging may be applied to raw measurements. The detected quality data is recorded into data storage along with a timestamp of when the measurement is taken, which completes the sensing phase. In one embodiment, the data storage is in the RF transmission device. The data storage may keep a number of most recent measurement records.

In an alternative embodiment, the RF transmission device in a sensor setup may also be connected to other diagnostic sensors such as sensors for measuring environmental conditions such as temperature, humidity, etc. In one embodiment, the readings of these diagnostic sensors would also be entered into the data storage of the RF transmission device.

After the communication phase begins, the sensor setup will attempt to locate a second device adapted to transmit an RF signal and establish a connection to it. If such a connection is established, after authentication and other precursor operations, the diagnostic sensor data being stored on the RF transmission device can be wirelessly transmitted along with any additional measurement data in its storage and the device's own identity, to a second RF transmission device. When this transmission is completed, the communication phase ends and the sensor setup shuts down. Even if the connection is not successful, the communication phase completes and the sensor setup shuts off. The setup then goes into its passive charging mode where induced power is gradually collected until enough power has accumulated to power another cycle.

In one embodiment, the diagnostic sensor data is collected by a second RF transmission device, for example, an operator's roaming unit. To get the diagnostic sensor readings, the operator with the second RF transmission device—the RF transmission device adapted to receive RF signals—travels in order to be within the RF communication range of each sensor setup. The operator then waits until the sensor setup completes a communication phase of a cycle whereby the roaming unit receives the sensor setup's data concerning the material medium. This data can be collected into analysis software which intelligently determines the trouble locations.

Figure 7:
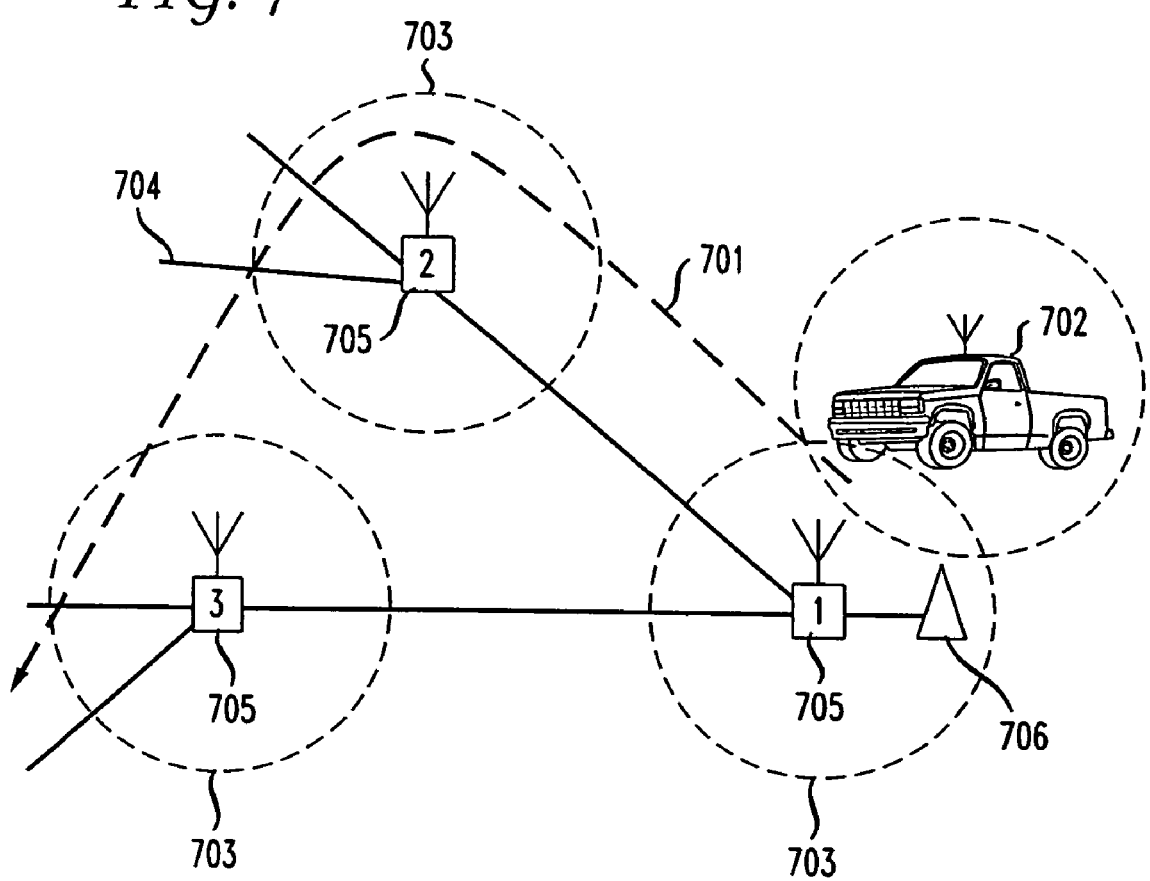
FIG. 7 is a schematic representation of a data harvesting scenario in which data is collected with a roaming unit.

FIG. 7 is a schematic representation of a data harvesting scenario in which data is collected with a roaming unit. A testing tone generator, 706, issues test tone of varying frequencies along a material medium, 704. The three diagnostic sensors, 705, in the network detect the tones and record data regarding the tones they receive. These sensor setups also have RF transmission means. An RF signal is transmitted and a roaming unit, 702, goes along a collection trajectory, 701. The trajectory is chosen such that the roaming unit goes within an RF communication range, 703, of each sensor setup.

A few of the strengths of the Harvesting Scenario over the exemplary model shown in FIG. 1 are as follows. First, in the Harvesting Scenario, a sensor setup can receive power and transmit its collected diagnostic data without needing to intrude into a material medium. Second, given that a sensor setup does not need to intrude into the material medium to make its diagnostic reading, a multiplicity of sensor setups may be placed along the material medium with relatively minimal effort. These sensors can determine if EM energy is flowing through a material medium by detecting induced energy. If the sensor detects induced energy, then there is EM energy flowing through the material medium. If the sensor does not detect induced energy, then there is no EM energy flowing through the material medium. In the background art, data can be determined only at points of intrusion into the material medium. For the sake of practicality, such an evaluation is reserved for DMARC points where a material medium can be more easily accessed. However, due to the infrequency of DMARC points; to actually pinpoint a fault requires intrusion into the material medium when troubleshooting a fault. This is an often lengthy and involved process which leads to significant investment of labor, expense, and loss of utility service for customers.

An alternative embodiment involves using a Mesh Networking Scenario instead of a Harvesting Scenario. A Mesh Network combines usage of RF signal transmission devices that operate continuously with RF signal transmission devices that operate in pulses. The RF devices operating continuously may be described as Full Function Devices (FFD), while the RF devices operating in pulses may be described as Reduced Function Devices (RFD). The FFDs are primarily used in this scenario as routers and aggregators for RF signals.

In one embodiment, an RFD selects an FFD to be its "parent node". One ramification of establishing a parent node is that the RFD can send its diagnostic sensor data via RF signal to the FFD parent node. The FFD then aggregates the data in preparation for future processing. In one example, an RFD determines which FFD to be its parent node based on which FFD within RF communication range is sending the RFD the strongest RF signals. In another example, an RFD chooses the FFD which is closest to itself to be its parent node. In the Mesh Scenario, the task cycles of the RFDs are not only constrained by their own power charging cycle, they are also regulated by the communication cycles that are coordinated by the RFDs' corresponding parent FFDs.

Figure 8:
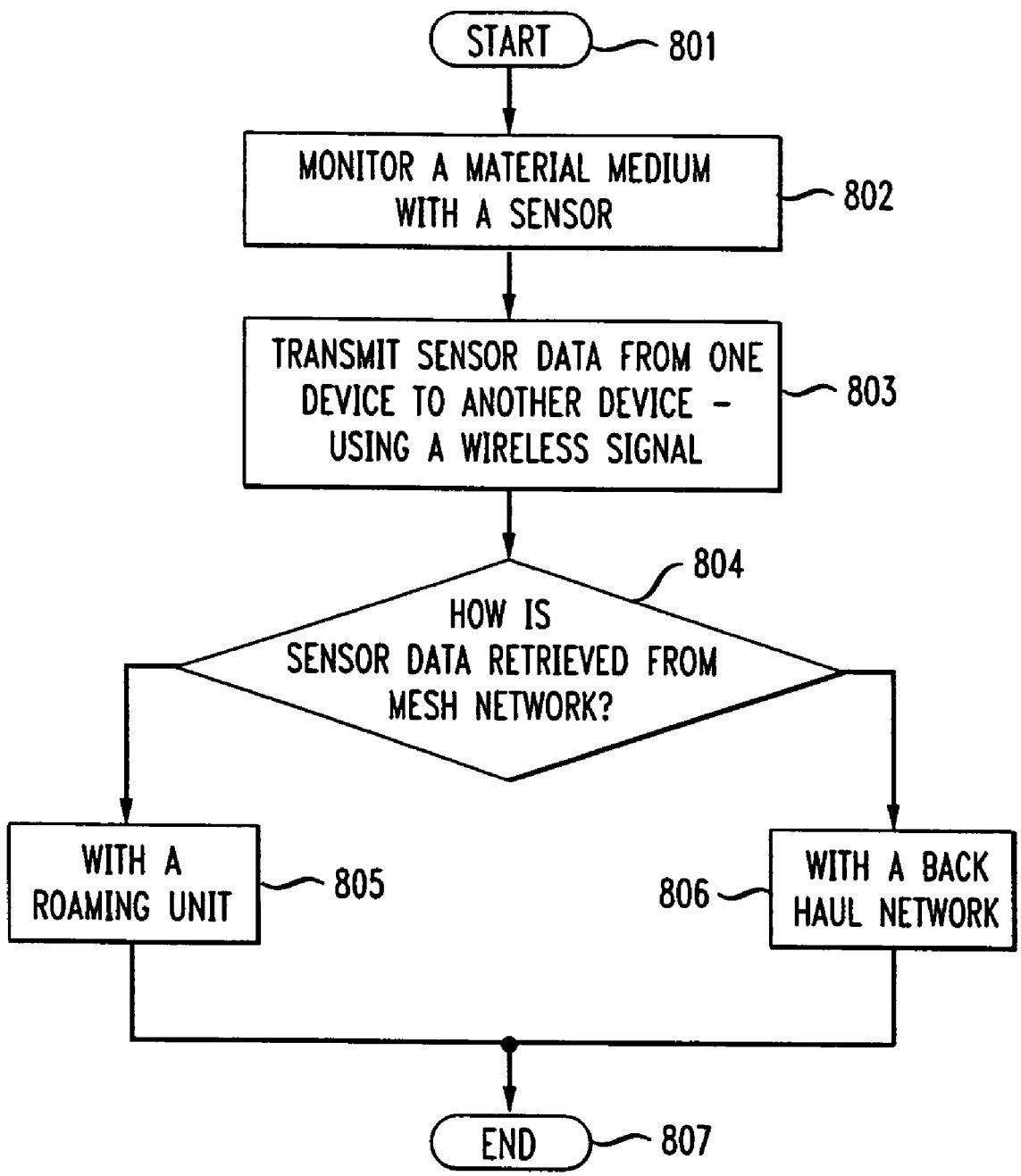
FIG. 8 is a flowchart for a Mesh Network embodiment of the invention.

FIG. 8 is a flowchart for a Mesh Network embodiment of the invention. The process starts at step 801. If the powering is through a power line or regular battery, the process can start at any time. If the powering is accomplished by capturing energy induced by EM energy flow, the process can start when there is enough charge in the capacitor-like slow-charging electrical storage device to power a full cycle. Step 802 shows that a material medium is being monitored with a diagnostic sensor. At step 803, diagnostic sensor data is transmitted from one device to another device using a wireless EM signal. In one embodiment, the wireless EM signal is an RF signal.

At the next step, 804, it is determined how sensor data is retrieved from the Mesh Network. One deployment strategy, at step 805, ensures that at least one of the FFDs in the network can transmit data by RF above ground. Through the above ground RF transmission, a roaming unit can be placed in proximity to that FFD and gain access to the entire Mesh Network. An alternative deployment strategy, at step 806, ensures that at least one of the FFDs has a back haul communication link. Through this back haul communication link, all sensor measurements can be reported to a central server which, in one embodiment, automatically analyzes the data. In one embodiment, the Internet is used as a back haul network by which to transfer data to the server.

The process ends at step 807 when the transmission of the data is completed.

Figure 9:
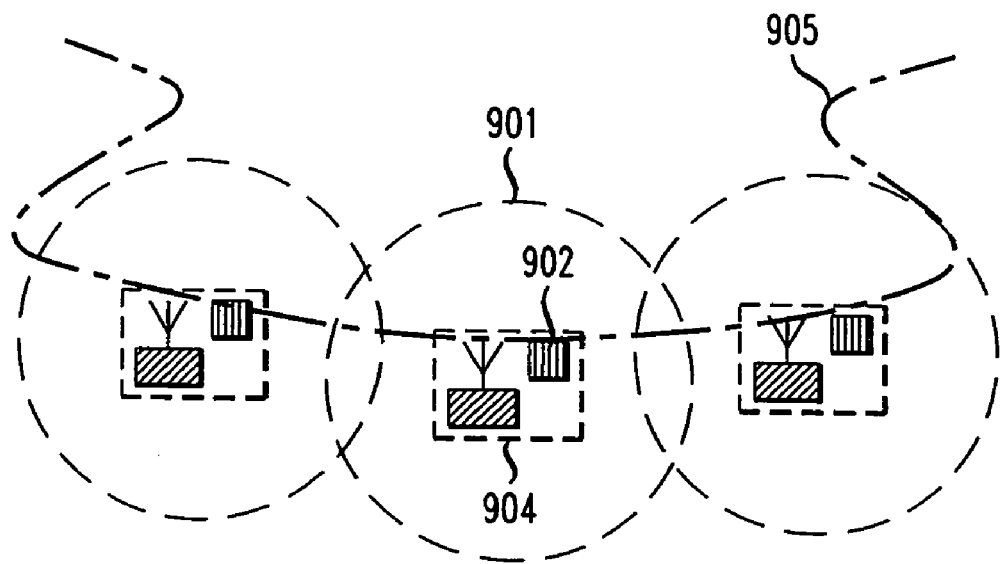
FIG. 9 is a schematic representation of a mesh network comprising diagnostic sensors and RF data transmission devices.

FIG. 9 is a schematic representation of a mesh network comprising diagnostic sensors, 902, and RF data transmission devices, 903, located along a material medium, 905. Each diagnostic sensor is either only communicatively coupled or both communicatively and electronically coupled to an RF data transmission device to make up a sensor setup, 904. The Mesh Network is dependent on each of the sensor setups being within RF communication range, 901, of each other. In this embodiment, each sensor setup communicates with its neighbor by propagating wireless RF signals through the atmosphere.

Figure 10:
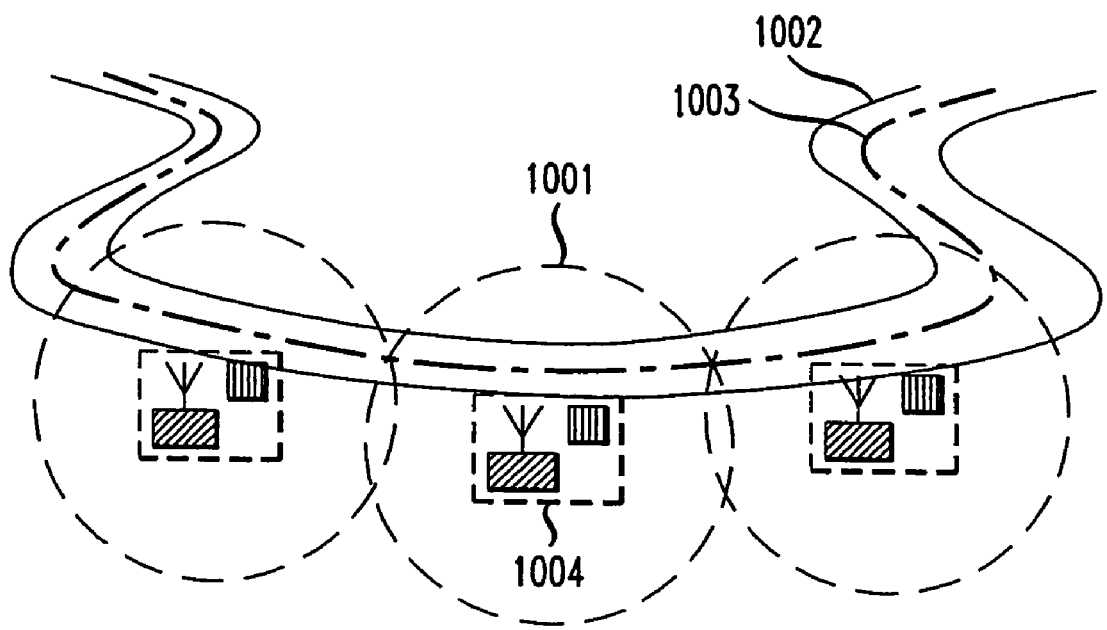
FIG. 10 is a schematic representation of communication with a waveguide in a mesh network.

FIG. 10 is a schematic representation of communication with a waveguide in a mesh network. The material medium, 1003, is surrounded by conduit, 1002, which functions as a waveguide. Propagating the wireless RF signal through a waveguide—herein called the Waveguide Mode—has the advantage of expanding a sensor setup's RF transmission range, 1001. Propagating the RF signal through a waveguide allows sensor setups, 1004, to be communicatively linked even when the sensor setups are underground and cannot successfully propagate the RF signal through the atmosphere to each other. Additionally, the Waveguide Mode allows the sensor setups to be placed further from each other while remaining within each other's RF communication range. For the purposes of this invention, transmitting a wireless EM signal—such as an RF signal—over a waveguide is considered a wireless transmission. A wired transmission is when non-wireless EM signal is transmitted by a material medium.

Figure 11:
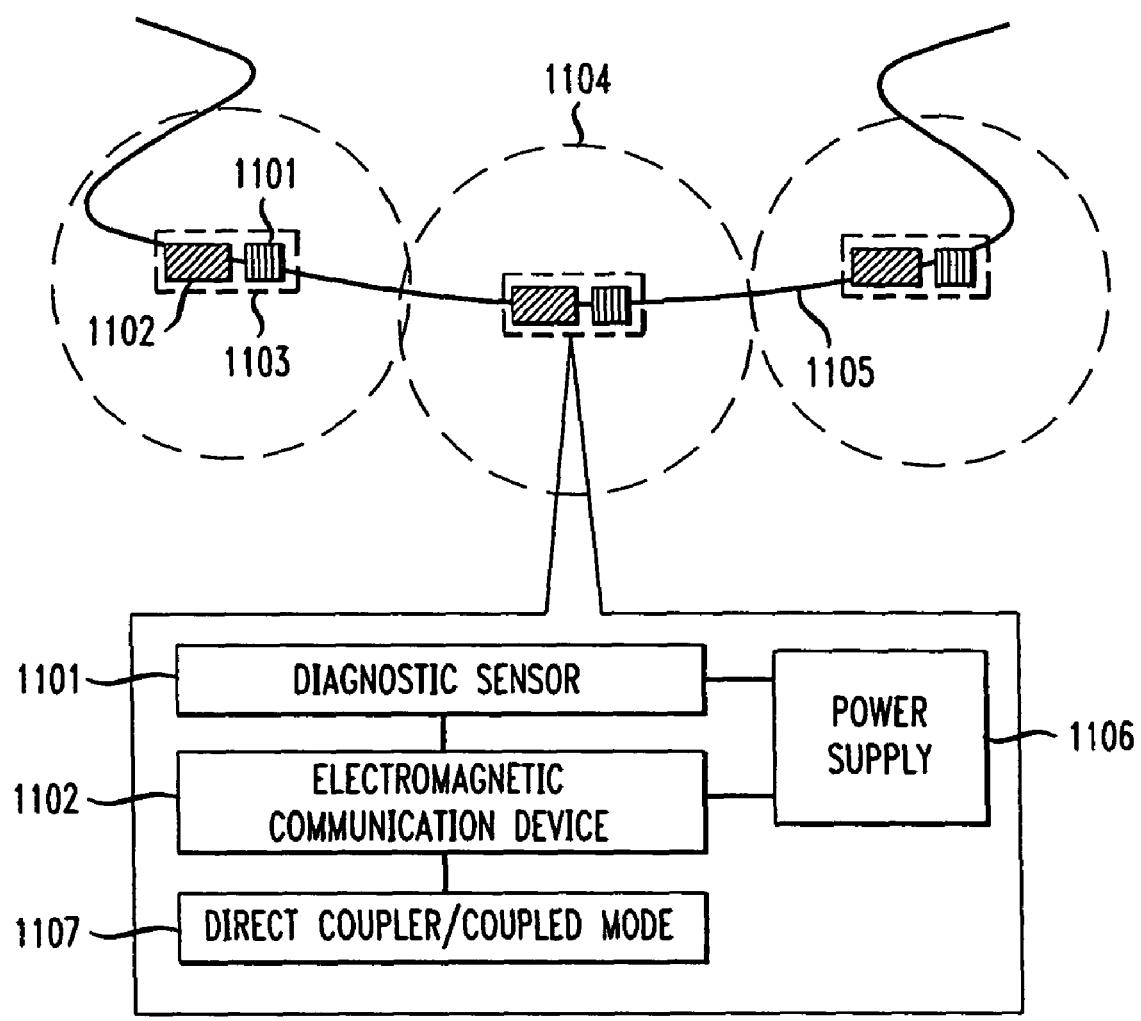
FIG. 11 is a schematic representation of communication by coupling antennas to a material medium in a mesh network.

FIG. 11 is a schematic representation of communication by coupling antennas to a material medium, 1105, in a mesh network. In this embodiment, an electromagnetic (EM) communication device, 1102, is either communicatively linked or electronically and communicatively linked to a diagnostic sensor device, 1101, to make a sensor setup. In a different embodiment, one device performs both of these functions. An antenna coupler, 1107, is used to attach an antenna of the EM transmission device to the material medium. The EM transmission device's antenna is normally used to propagate an RF signal into the atmosphere or into a waveguide. Here, however, instead of transmitting RF signal, the EM transmission device transmits EM energy directly into a material medium by means of the direct coupler. Using the direct coupler to transmit EM energy by means of the material medium is herein called the Coupled Mode.

When using the Coupled Mode, in one embodiment, the transmitted EM energy goes from a transmission device to a high pass filter before entering a material medium. The high pass filter is useful for keeping the EM energy carrying the diagnostic sensor data separate from the other EM energy being propagated on the material medium.

The Coupled Mode has some advantages. One advantage is that it can be used even when a material medium is underground. Additionally, the Coupled Mode can be used even when the material medium or the material medium conduit cannot be used as a waveguide. Another advantage is that using the Coupled Mode expands the range over which the communication devices can communication, since EM energy can be propagated in the material medium further than an RF signal can be propagated in the atmosphere.

A power supply, 1106, powers both the sensor and the communication device. In one embodiment, there is just one power source for both. In another embodiment, there are at least two power sources for the sensor setup.

Figure 12:
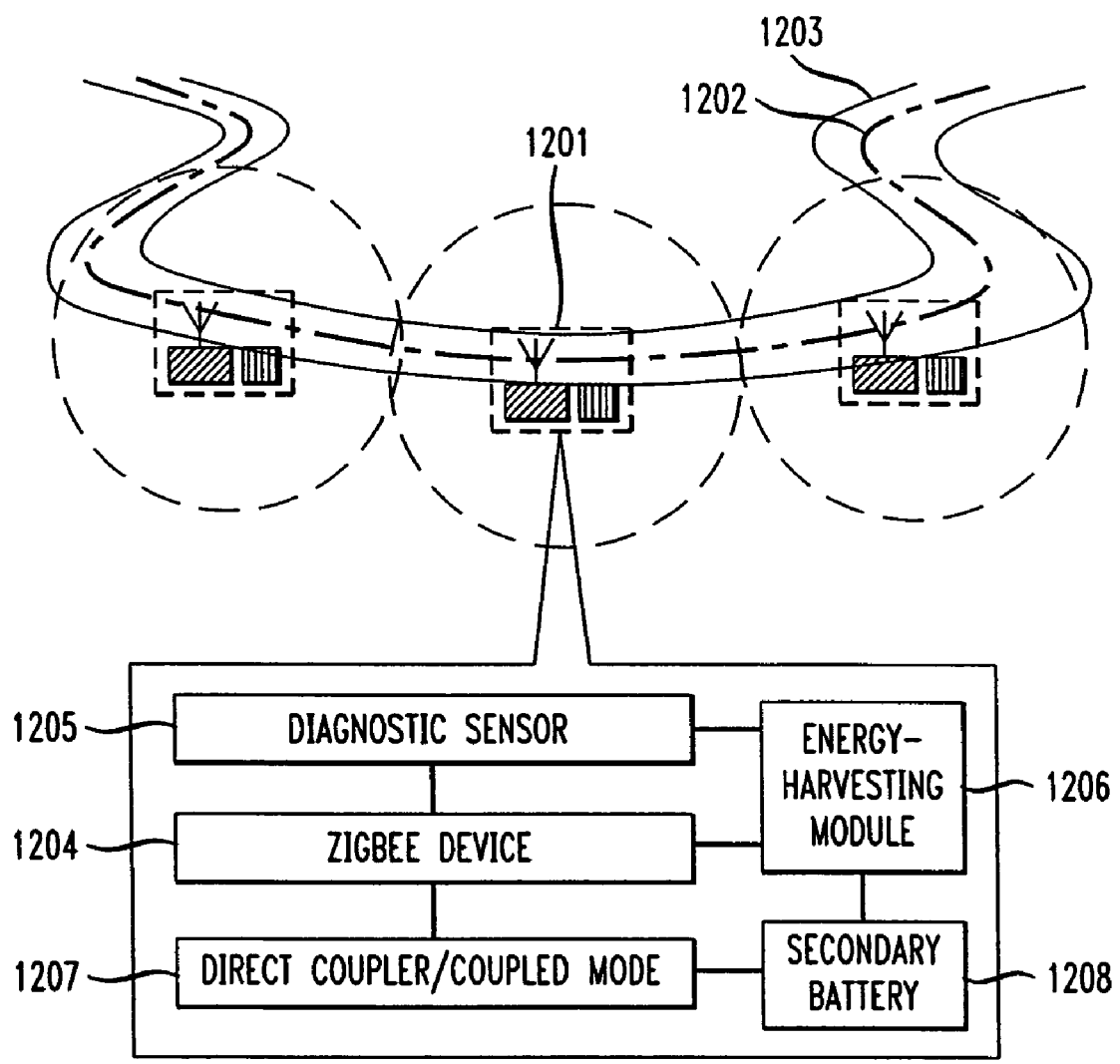
FIG. 12 is a schematic representation of an embodiment which combines different aspects of the invention.

FIG. 12 is a schematic representation of an embodiment which combines different aspects of the invention. Additionally, in this embodiment, a specific type of RF communication device called a Zigbee is utilized. A Zigbee is a type of RF communication device that can be used to facilitate an interconnected Mesh Network, as will be shown in detail in FIGS. 13-15. An advantage of the Zigbee device is that it is Internet Protocol (IP) enabled and addressable. Being IP enabled and addressable means that each Zigbee device has a unique way to be identified, which helps to facilitate making an integrated network among several different Zigbee devices. Also, a Zigbee network administrator can probe for diagnostic sensor data concerning a specific location by calling the IP address of the Zigbee device in that specific location. This ability to pinpoint diagnostic sensor data is helpful in troubleshooting a fault in a material medium.

Zigbee is just one of several device types than is able to self-organize into a store-and-forward multi-hop wireless mesh network with at least one other device capable of transmitting RF signal. Some of the other examples of similar device types are: Wibree devices, EnOcean devices, and SNAP devices.

The concept of the Mesh Network being able to "self-organize" which was mentioned above means that devices are installed with algorithm and protocol implementations that, when run, can figure out how to forward data from an arbitrary source to an arbitrary destination within the network according to certain predetermined policies. These devices can also compute any logical network structure that needs to be built, (i.e. figure out a hierarchy relationship among nodes if the forwarding algorithm requires such), for completing data forwarding computation, and other related tasks as well. See FIG. 15 for an illustration of such a hierarchy relationship.

By devices exchanging and propagating information regarding with whom each device throughout the network can communicate, a topology graph can be constructed and each device can use this graph to compute the shortest path towards any destination. Then when a device receives data that requires forwarding—that is, this device is not the final destination for the data—it knows to which device it should forward this data.

In this embodiment, a diagnostic sensor, 1205, is communicatively connected to the Zigbee device, 1204, to make a sensor setup. The sensor setup has at least three options for how to communicate with a neighboring sensor setup. The sensor setup can propagate wireless EM signals, such as RF signals, into the atmosphere and into a material medium conduit, 1203, or the sensor setup can propagate EM signals directly into a material medium, 1202, by means of a direct coupler, 1207. When direct couplers are used to communicate, then the sensor setups would be linked into a material medium, not merely placed surrounding a material medium as is depicted in the figure.

The sensor setup is powered, in this embodiment, by an energy-harvesting module, 1206, for its primary power source. The power collected by the energy-harvesting module may be stored in a capacitor-like slow-charging electrical storage device. As a secondary power source, a regular battery, 1208, is employed.

Figure 13:
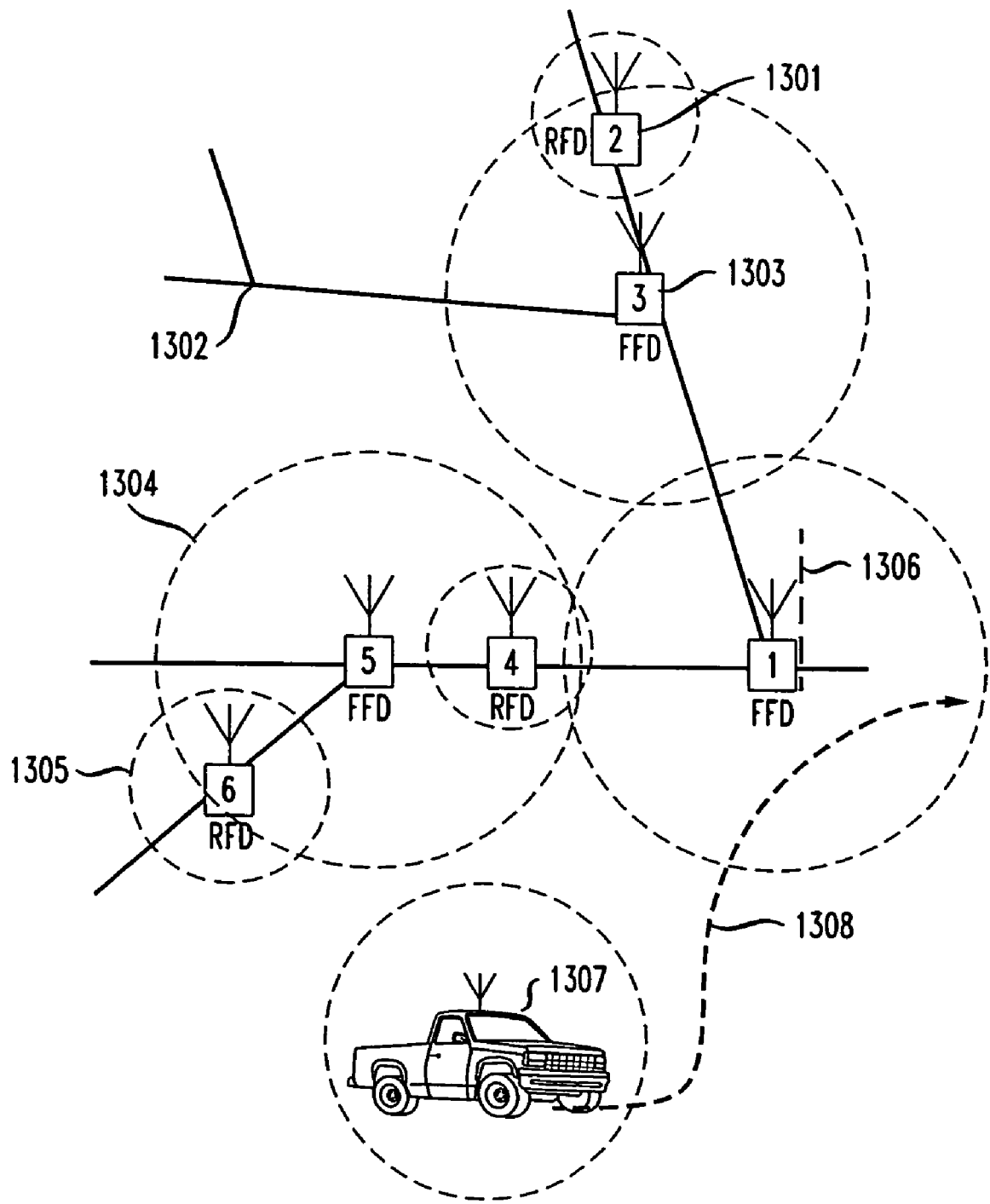
FIG. 13 is a schematic representation of a mesh network deployment where data is collected with a roaming unit.

FIG. 13 is a schematic representation of a mesh network deployment where data is collected with a roaming unit, 1307. The Mesh Network is made up of Full Functional Devices (FFD), 1303, and Reduced Function Devices (RFD), 1301. The FFDs require constant power in order to do more complex operations such as serving as routers for RFDs and mesh network coordinators. A straightforward way to supply the constant powering is to put the FFDs at DMARC points in the system. An example of a DMARC point, 1302, is where two material media meet. At the DMARC points, the FFD can readily access the material medium. Therefore, energy can be transmitted along the material medium to power the FFD. The RFDs may operate in pulses. This allows for powering an RFD by use of energy induced by EM energy flow through a material medium or the material medium's conduit, and to capture this energy with a capacitor-like slow-charging electrical storage device. In this embodiment, each RFD finds the closest parent FFD within the RFD's radio frequency (RF) communication range, 1305, and transmits its identity and diagnostic sensor data to the FFD.

The FFDs then communicate with other FFDs within each other's RF communication range, 1304. The FFDs may communicate with each other by transmitting the RF signal through the atmosphere, by transmitting the RF signal into a material medium waveguide, or by transmitting the RF signal directly into a material medium by means of a direct coupler.

This embodiment utilizes a roaming unit, 1307, equipped to receive RF signal transmitted into the atmosphere. Therefore, at least one of the FFDs needs to transmit an RF signal into the atmosphere. This is done on FFD number 1 by means of an antenna, 1306. However, FFD number 1 is not limited to communicating with the other FFDs in the network by means of propagating RF signal into the atmosphere. Rather, it can use any means of RF communication previously discussed, or any other means known in the art. The roaming unit takes a path 1308 so that the unit passes within the transmission range of FFD number 1.

Figure 14:
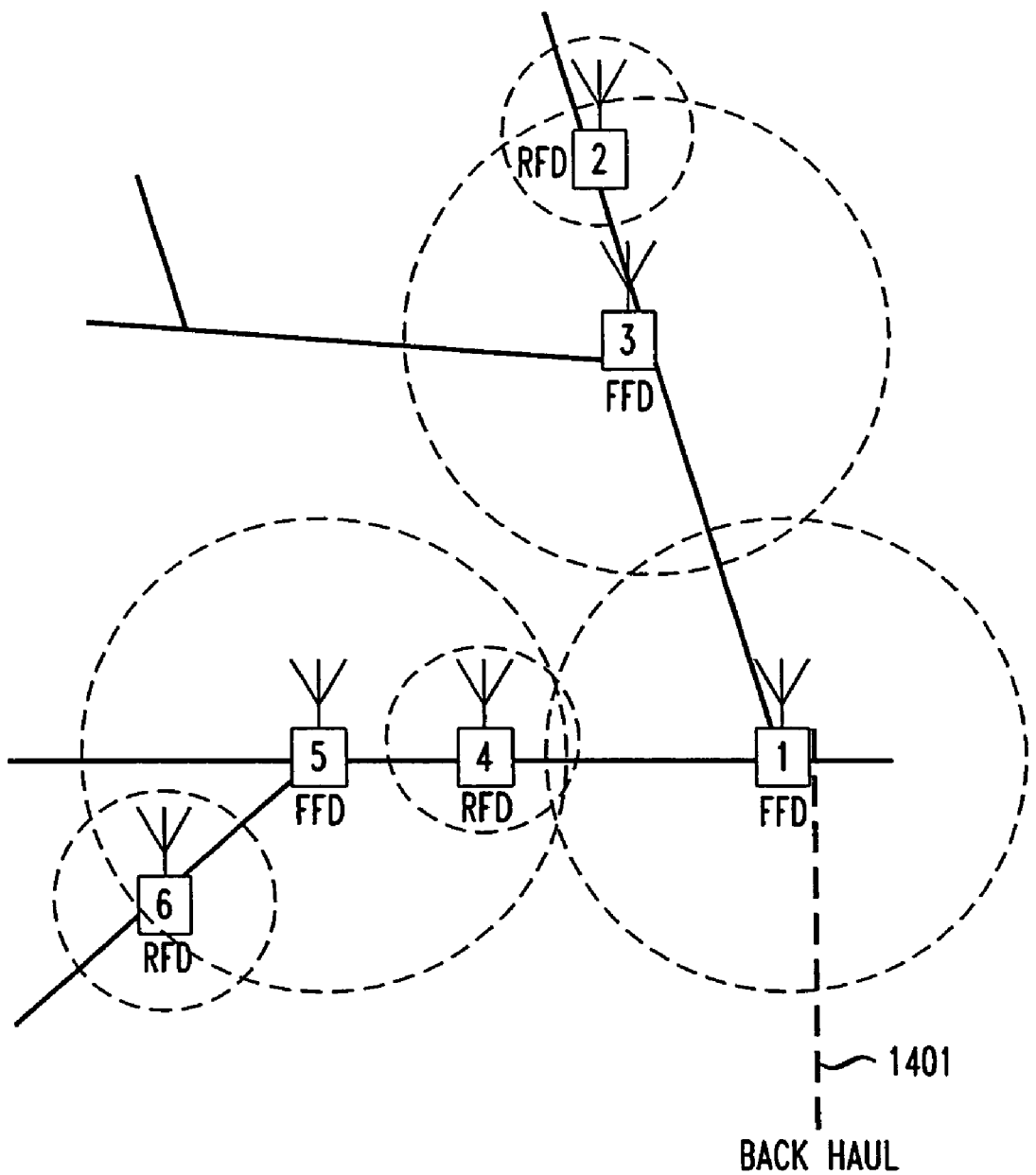
FIG. 14 is a schematic representation of a mesh network deployment where data is collected with a back haul communication link.

FIG. 14 is a schematic representation of a mesh network deployment where data is collected with a back haul communication link, 1401. This figure is identical to the Mesh Network Scenario in FIG. 13, except instead of using a roaming unit to collect the network data from one of the FFDs which propagates RF signal into the atmosphere; this embodiment collects data by means of a back haul communication link. An example of a back haul communication link is a wireless IP broadband connection such as a 4G WiFi Neighborhood Area Network connection. An example of a back haul network is the Internet. In one embodiment, a server connected to the back haul network is used to collect and process the Mesh Network data.

The FFDs that can communicate with each other form a Mesh Network. In this embodiment, the deployment strategy ensures that for each Mesh Network, there is at least one RF transmission device which has a back haul communication link. Through this back haul communication link, all sensor measurements can be reported to a central server which automatically analyzes the data.

For the Mesh Network Scenarios previously described, it may not be necessary to have a testing tones generator, see 706, and diagnostic sensor setups designated to measure the testing tones. In the embodiment where the RF signals are propagated in a waveguide—either the material medium itself or a conduit surrounding the material medium—the ability of one sensor setup to communicate with another sensor setup implies the connectivity of the underlying material medium system between these two setups. Therefore, detecting the connectivity of the entire Mesh Network confirms the connectivity of the underlying material medium system. To take advantage of this information, the topology of the mesh networks formed among sensor setups will need to be reported to a central server. This can be done when each sensor setup reports the identities of its mesh neighbors.

While connectivity of a Mesh Network may avoid a need to have specific sensors for detecting testing tones issued by a testing tone generator; it is still desirable to measure local environmental conditions in proximity to the material medium. Therefore, having diagnostic sensors coupled to RF communication means or devices is desirable, even in an interconnected Mesh Network.

Figure 15:
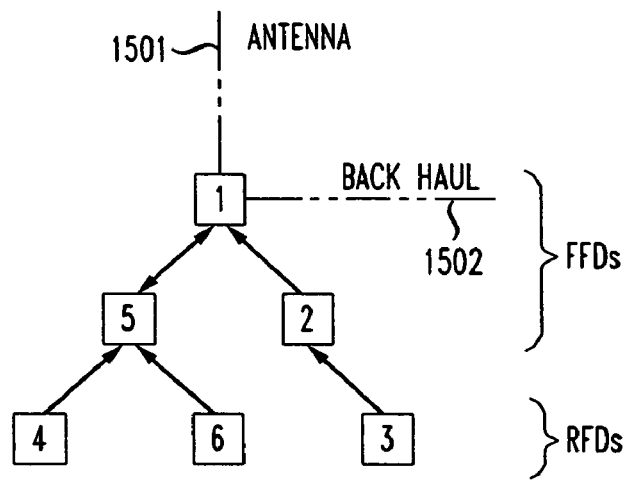
FIG. 15 is a schematic representation of a mesh network topology as a hierarchy relationship.

FIG. 15 is a schematic representation of a mesh network topology of FIG. 14 as a hierarchy relationship. The Mesh Network is made up of FFDs and RFDs. In this embodiment of the Mesh Network, each RFD identifies an FFD as its parent node. In the Mesh Network from FIG. 14, RFDs numbers 4 and 6 make FFD number 5 their parent node. RFD number 3 make FFD number 2 its parent node. Furthermore, FFDs numbers 1, 2 and 5 are interconnected—since they are within at least one of the other FFD's RF transmission range.

This hierarchy relationship shows FFD number 1 possessing both an antenna, 1501, and a back haul communication link, 1502. This is only for illustration purposes, since one of these connection types is sufficient to communicate data outside of the Mesh Network.

For example, in FIG. 13, in 1306, FFD number 1 possessed an antenna for transmitting RF signal into the atmosphere, thus allowing a roaming unit, 1307 to travel on a path, 1308, such that the roaming unit would be within RF transmission range of the FFD device. This allows the roaming unit to recover all Mesh Network diagnostic sensor measurements.

Alternatively, in FIG. 14, FFD number 1 possesses a back haul communication link, 1401, which allows all Mesh Network diagnostic sensor measurements to be transmitted to a server by means of a back haul network.

Figure 16:
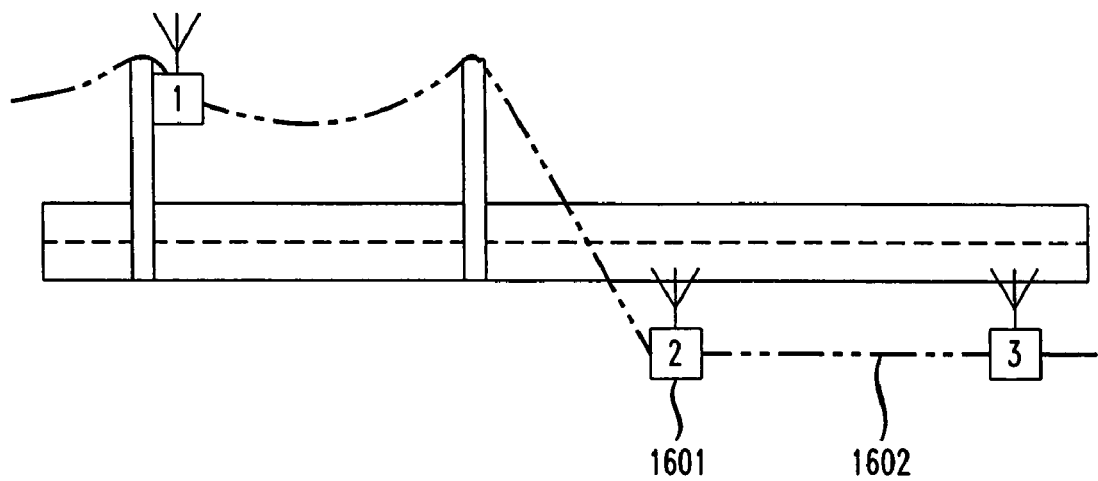
FIG. 16 is a schematic representation of monitoring a diagnostic sensor located on an above and below ground material medium.

FIG. 16 shows monitoring a series of diagnostic sensors located on an above and below ground material medium. Sensor setups, 1601, are located in various positions along a material medium, 1602. Sensor setup number 1 is located above ground, while sensor setups number 2 and 3 are located below ground. This figure shows the versatility of the sensor setups, allowing for diagnostic monitoring is various different locations along a material medium.

Figure 17:
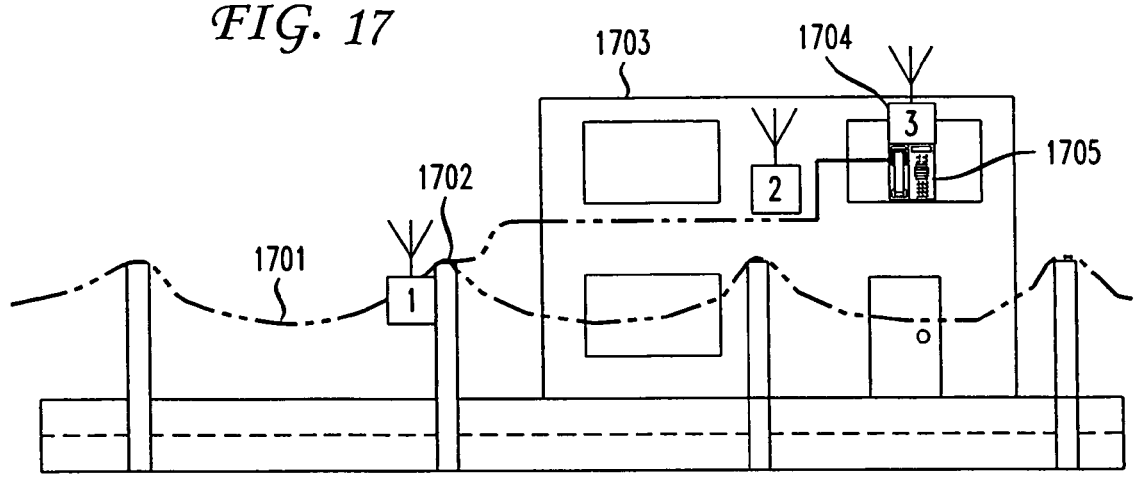
FIG. 17 is a schematic representation of monitoring a material medium as it goes to an end device in a facility, building or residence.

FIG. 17 shows monitoring a material medium as it goes to an end device in a facility, building or residence. In this embodiment of the invention, diagnostic monitoring extends past a DMARC point located outside of the facility, building or residence. This embodiment essentially expands a "network edge" DMARC point from outside a user's location to including the material medium inside a user's location all the way to a user's device. Some examples of a utility being delivered to a user include telecommunication's service and power service.

The figure shows several sensor setups, 1704, that are numbered 1, 2, and 3. In this embodiment, the sensor setups are used to monitor a material medium, 1701, from a DMARC point, 1702, as the material medium enters a facility, building, or residence, 1703, and proceeds to a user's end device, 1705. In this embodiment, the material medium is carrying telecommunication's service to a user's telecommunication device. Other embodiments with other user devices and other utility services may be envisioned.

Sensor setup number 1 allows for sensing the utility service at a DMARC point as a service material medium departs from a main material medium. Sensor setup number 2 allows for sensing the utility service at an intermediate point inside a facility, building, or residence. Sensor setup number 3 allows for sensing the utility service at the user's end device. Alternatively, the sensor setups may be used to detect an environmental condition at these various locations.

Figure 18:
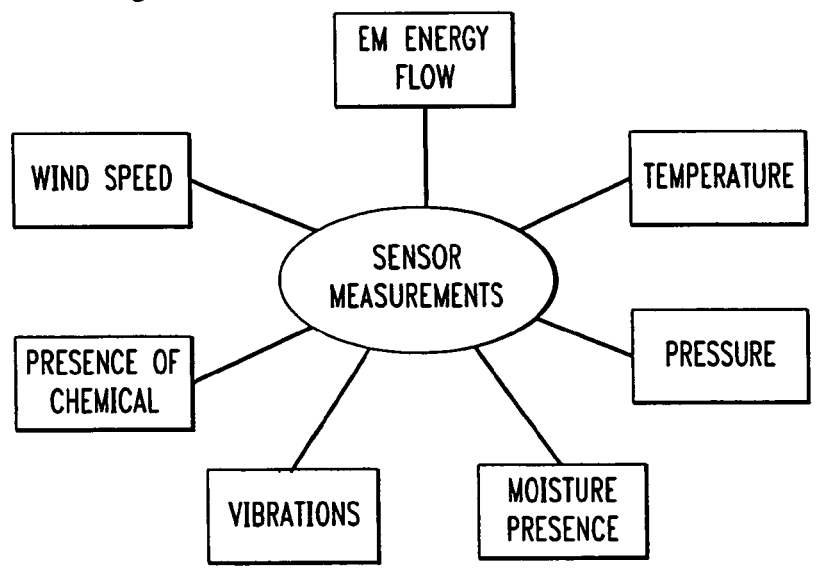
FIG. 18 is a schematic representation of some possible diagnostic sensor measurements of interest when monitoring a material medium.

FIG. 18 shows some possible diagnostic sensor measurements of interest when monitoring a material medium. One type of measurement is EM energy flow, which measures the material medium's operability. Another type of measurement is an environmental condition, which measures an environmental condition in proximity to a material medium instead of the operability of the material medium itself. An environmental measurement allow for detecting potential threats to a material medium's operational health. Additionally, an environmental measurement may be used to identify a potentially threatening environmental condition to a structure in proximity to the material medium. Some environmental conditions of interest include: temperature, pressure, moisture, vibrations, presence of a chemical, and wind speed. Other environmental conditions of interest may also be envisioned.

Figure 19:
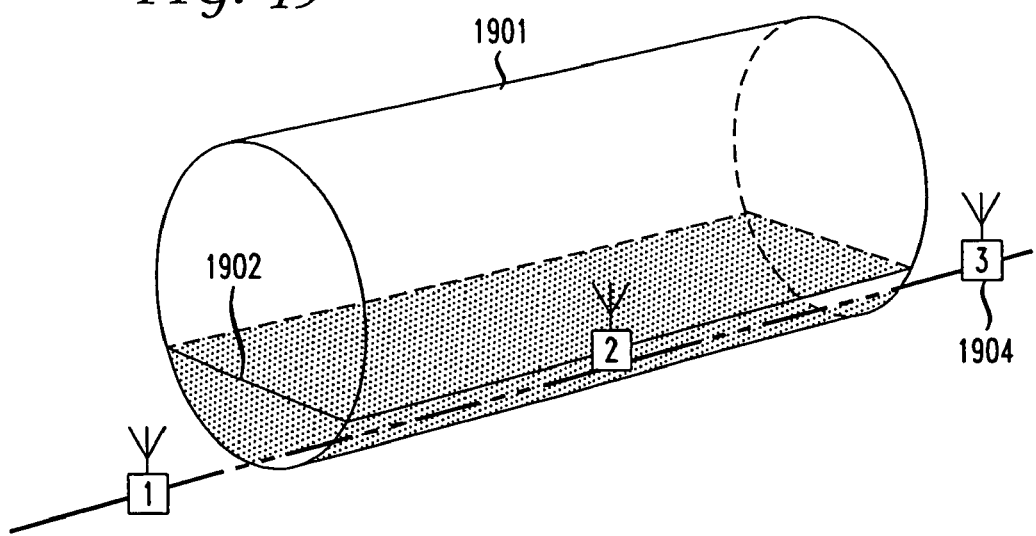
FIG. 19 is a schematic representation of how a material medium can be used to monitor environmental conditions in a tunnel.

FIG. 19 shows how a material medium can be used to monitor environmental conditions in a tunnel. In this embodiment, a tunnel, 1901, has had an influx of water, 1902, which is flooding the lower part of the tunnel. By using sensor setups, 1904, equipped with diagnostic sensor for sensing a presence of moisture in proximity to a material medium, 1903, this flooding problem can be detected early. An early detection of the moisture problem allows for earlier troubleshooting to be done. An additional advantage is that if there is a threat to the tunnel's structural integrity, potential victims can be timely evacuated from the location before a catastrophic failure.

Figure 20:
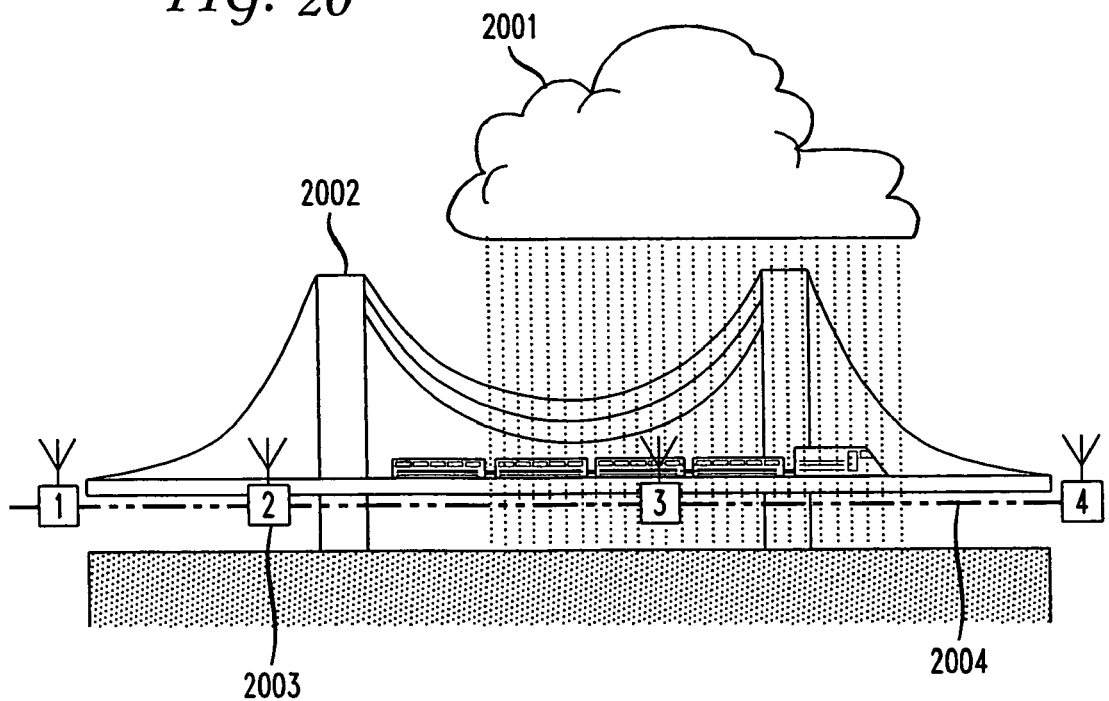
FIG. 20 is a schematic representation of how a material medium can be used to monitor environmental conditions on a bridge.

FIG. 20 shows how a material medium can be used to monitor environmental conditions on a bridge. In this embodiment, a storm condition, 2001, travels past a bridge, 2002. Sensor setups, 2003, are placed along a material medium, 2004. Some conditions of interest concerning a bridge include detecting wind speed and vibrations. If these conditions exceed a normal range, then early action can be taken to avoid harm to those using the bridge. Additionally, it may be possible to take precautions in maintaining the integrity of the bridge's structure. The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A method comprising:
  monitoring a material medium adapted to transmit electromagnetic (EM) energy, the monitoring using at least one sensor located in proximity to the medium, the at least one sensor configured to wirelessly transmit a radio frequency (RF) signal;
  transmitting wirelessly an EM wave signal comprising data originating from the at least one sensor;
  self-organizing the at least one sensor and a second sensor into a store-and-forward multi-hop wireless mesh network based on a hierarchical relationship between the at least one sensor and the second sensor, the second sensor being located in proximity to the medium and configured to transmit an RF signal;
  determining whether a roaming unit adapted to receive an RF signal is within RF communication range of one or more of the at least one sensors within the wireless mesh network, where the one or more of the at least one sensors is configured to transmit a radio frequency signal; and
  transmitting data, from the one or more of the at least one sensors to the roaming unit.

2. The method of claim 1, further comprising powering the at least one sensor using energy induced by EM energy transmitted by the medium or by a conduit surrounding the medium.

3. The method of claim 2, further comprising capturing, in an energy harvesting module, energy induced by the EM energy.

4. The method of claim 1, further comprising:
  transmitting, from the at least one sensor, data originating from the second sensor.

5. The method of claim 1, wherein the EM wave signal is an RF signal.

6. The method of claim 1, wherein the RF signal is transmitted by a first device selected from the group consisting of: a Zigbee device, a Wibree device, an EnOcean device, and a SNAP device.

7. The method of claim 1, further comprising powering a first device using energy induced by EM energy transmitted by the medium or by a conduit surrounding the medium.

8. The method of claim 7, further comprising capturing, in an energy harvesting module, energy induced by the EM energy.

9. The method of claim 8, wherein the energy harvesting module uses a capacitor-like slow-charging energy storage device to store power.

10. The method of claim 1, further comprising transmitting data wirelessly from the second sensor to the first sensor using an RF signal transmitted over a waveguide.

11. The method of claim 10, wherein the waveguide is the material medium or a conduit housing the material medium.

12. The method of claim 1, further comprising:
transmitting data, from the first device, to a roaming unit adapted to receive an RF signal.

13. The method of claim 1 further comprising:
transmitting data from the first device through a back haul connection to a back haul network.

14. The method of claim 13, wherein the back haul network is the Internet.

15. The method of claim 1, wherein the medium is located under the ground.

16. The method of claim 1, wherein the medium being monitored is located inside a facility, building, or residence.

17. The method of claim 1, wherein the sensor is used to measure a quantity selected from the group consisting of:
(1) EM energy flow, (2) temperature, (3) pressure, (4) moisture, (5) vibration, (6) percentage of a designated chemical, and (7) wind speed.

18. A system for monitoring a material medium carrying electromagnetic (EM) energy comprising:
a first sensor of a plurality of sensors located in proximity to the material medium and comprising first means-for transmitting a radio frequency (RF) signal representative of a value measured by the first sensor; and a first power supply adapted to supply power to the first sensor and the first means adapted to transmit an RF signal;
a second sensor of the plurality of sensors located in proximity to the material medium and comprising second means for transmitting a radio frequency (RF) signal representative of a value measured by the second sensor and a second power supply adapted to supply power to the second sensor and the second means adapted to transmit an RF signal;
wherein at least one of the first sensor and the second sensor is configured to determine whether a roaming unit adapted to receive an RF signal is within RF communication range of the transmission sensor, where the transmission sensor is configured to transmit a radio frequency signal to the roaming unit; and
means for self-organizing the plurality of sensors into a store-and-forward multi-hop wireless mesh network based on a hierarchical relationship among the plurality of sensors.

19. The system of claim 18, further comprising:
the first power supply adapted to receive power from energy induced by EM energy transmitted by the medium.

20. The system of claim 18, further comprising:
the first power supply adapted to receive power from energy induced by EM energy transmitted by a conduit surrounding the medium.

* * * * *